(12) United States Patent
Nakamura et al.

(10) Patent No.: US 11,629,400 B2
(45) Date of Patent: Apr. 18, 2023

(54) SPUTTERING TARGET AND METHOD OF PRODUCING THE SAME

(71) Applicant: ULVAC, INC., Chigasaki (JP)

(72) Inventors: Akira Nakamura, Chigasaki (JP); Hisashi Iwashige, Chigasaki (JP); Seiya Nishi, Chigasaki (JP); Hideto Nagashima, Chigasaki (JP); Koji Suzuki, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 0 days.

(21) Appl. No.: 16/966,807

(22) PCT Filed: May 16, 2019

(86) PCT No.: PCT/JP2019/019494
§ 371 (c)(1),
(2) Date: Jul. 31, 2020

(87) PCT Pub. No.: WO2019/225472
PCT Pub. Date: Nov. 28, 2019

(65) Prior Publication Data

US 2021/0087672 A1 Mar. 25, 2021

(30) Foreign Application Priority Data

May 21, 2018 (JP) .............................. JP2018-096945

(51) Int. Cl.
*C23C 14/34* (2006.01)
*C23C 14/14* (2006.01)
(Continued)

(52) U.S. Cl.
CPC .......... *C23C 14/3414* (2013.01); *B21D 22/02* (2013.01); *C23C 14/14* (2013.01); *H01J 37/3423* (2013.01); *H01J 37/3426* (2013.01)

(58) Field of Classification Search
CPC ................................................ C23C 14/3414
See application file for complete search history.

(56) References Cited

U.S. PATENT DOCUMENTS 9,779,920 B2 * 10/2017 West ..................... H01J 37/347
2002/0003010 A1 1/2002 Shah et al.
(Continued)

FOREIGN PATENT DOCUMENTS

JP 11-50241 A 2/1999
JP 2000-509765 A 8/2000
(Continued)

OTHER PUBLICATIONS

Translation to Ueda (JP 2013-057112) published Mar. 2013.*
(Continued)

*Primary Examiner* — John J Brayton
(74) *Attorney, Agent, or Firm* — Saliwanchik, Lloyd & Eisenschenk

(57) ABSTRACT

A sputtering target according to an embodiment of the present invention includes: a plate-shaped target body formed of a metal material. The target body includes a target portion and a base portion. The target portion has a sputtering surface. The base portion has a cooling surface and includes a gradient strength layer, the cooling surface being positioned on a side opposite to the sputtering surface and having hardness higher than that of the sputtering surface, the gradient strength layer having tensile strength that gradually decreases from the cooling surface toward the target portion.

6 Claims, 4 Drawing Sheets

(51) Int. Cl.
*H01J 37/34* (2006.01)
*B21D 22/02* (2006.01)

(56) References Cited

U.S. PATENT DOCUMENTS

| | | |
|---|---|---|
| 2008/0308416 A1 | 12/2008 | Allen et al. |
| 2011/0056828 A1* | 3/2011 | Miao ................... C22C 21/00 |
| | | 204/298.13 |
| 2013/0306467 A1 | 11/2013 | Miao et al. |
| 2014/0318953 A1 | 10/2014 | Nagata et al. |
| 2014/0367253 A1 | 12/2014 | Okabe et al. |
| 2016/0071705 A1 | 3/2016 | Tsukamoto |
| 2017/0287685 A1* | 10/2017 | Ferrasse ............... H01J 37/3426 |
| 2018/0315586 A1 | 11/2018 | Takigawa |

FOREIGN PATENT DOCUMENTS

| | | |
|---|---|---|
| JP | 2002-121662 A | 4/2002 |
| JP | 2006-159223 A | 6/2006 |
| JP | 2007-63616 A | 3/2007 |
| JP | 2008-138274 A | 6/2008 |
| JP | 2011-517329 A | 6/2011 |
| JP | 2012-515847 A | 7/2012 |
| JP | 2013057112 A * | 3/2013 |
| JP | 2017-78226 A | 4/2017 |
| JP | 2018-35444 A | 3/2018 |
| WO | WO-2013/047199 A1 | 4/2013 |
| WO | WO-2013/105424 A1 | 7/2013 |

OTHER PUBLICATIONS

International Search Report in International Application No. PCT/JP2019/019494, filed May 16, 2019.
Office Action dated Mar. 8, 2022 in Chinese Application No. 201980026113.X.
Office Action dated Mar. 25, 2022 in Korean Application No. 10-2020-7024056.
Office Action dated Jul. 6, 2022 in Chinese Application No. 201980026113.X.

* cited by examiner

SPUTTERING TARGET AND METHOD OF PRODUCING THE SAME

CROSS-REFERENCE TO RELATED APPLICATIONS

This application is the U.S. national stage application of International Patent Application No. PCT/JP2019/019494, filed May 16, 2019, which claims the benefit under 35 U.S.C. § 119 of Japanese Application No. 2018-096945, filed May 21, 2018, the disclosures of each of which are incorporated herein by reference in their entirety.

TECHNICAL FIELD

The present invention relates to, for example, a sputtering target formed of high-purity aluminum or an aluminum alloy used for deposition of a wiring layer of a semiconductor device, an electronic part, or a flat panel display device.

BACKGROUND ART

A sputtering target formed of high-purity aluminum or aluminum alloy has a characteristic that the tensile strength thereof is lower than that of a general aluminum alloy material because of its high purity. Usually, a sputtering target receives a thermal stress that acts on a sputtering surface and a cooling water pressure that acts on the back surface thereof during sputtering. Further, since the thickness of the sputtering target is reduced due to consumption of the target material, the amount of deformation increases as the sputtering progresses, and a problem that the deposition rate of the film to be adhered to a substrate and the film thickness distribution fluctuate occurs. In view of the above, in order to inhibit the target from being deformed during sputtering, a method of integrally bonding a backing plate having strength higher than that of the target and avoiding direct water pressure on the target part is generally used.

As a backing plate, in addition to a jacket-type one including circulation passage of cooling water formed inside, for example, a baking plate called a hat-type including a cylindrical flange portion capable of housing a magnetic circuit including a permanent magnet is known (see, for example, Patent Literature 1). In this type of sputtering target (hereinafter, referred to also as the hat-type sputtering target), the backing plate is cooled by the cooling water supplied to the inside of the flange portion, and the target material is inhibited from being separated due to melting of a bonding material formed of indium or the like that bonds the target material and the backing plate.

Meanwhile, from the viewpoint of productivity, there is a demand for higher density of power to be applied to the sputtering target. As the power density increases, the heat resistance of the bonding material that bonds the target material and the backing plate becomes a problem. For this reason, in recent years, a sputtering target in which a target material and a backing plate are integrally formed without using a bonding material has been proposed.

For example, a method of forming a protrusion on the back surface of a target and bonding it to a backing plate by a mechanical method (see, for example, Patent Literatures 2 and 3), a method of bonding a target and a backing plate by diffusion bonding (see, for example, Patent Literatures 4 and 5), and a method of preparing a sputtering target integrated with a hat-type backing plate (see, for example, Patent Literature 6) have been known.

CITATION LIST

Patent Literature

Patent Literature 1: Japanese Patent Application Laid-open No. 2007-63616
Patent Literature 2: Japanese Patent Application Laid-open No. 2008-138274
Patent Literature 3: Japanese Unexamined Patent Application Publication No. 2011-517329
Patent Literature 4: Japanese Patent Application Laid-open No. 2006-159223
Patent Literature 5: Japanese Unexamined Patent Application Publication No. 2000-509765
Patent Literature 6: Japanese Unexamined Patent Application Publication No. 2012-515847

DISCLOSURE OF INVENTION

Technical Problem

In recent years, development of a hat-type sputtering target that can cope with an increase in size of a substrate has been promoted. In this case, since a backing plate is cylindrical, the target is bonded only to the outer peripheral portion of the back surface. Therefore, a water pressure and a stress due to thermal expansion simultaneously act on the back surface of the sputtering target, permanent deformation easily occurs beyond the yield point in an aluminum-based metal target having low strength, and there is a problem that the deposition characteristics (the film thickness distribution and deposition rate) change due to the deformation as described above.

Here, in the method of mechanically bonding the protrusion formed on the back surface of the target to the back plate as described above, electrical contact resistance is generated at the bonding portion, and thus, there is a possibility that the discharge voltage during sputtering increases, which causes the change in deposition characteristics and abnormal discharge. Further, in the method of bonding the target material and the backing plate by diffusion bonding, the particle size of the target becomes coarse and the orientation changes due to the pressure and thermal energy generated during diffusion bonding processing, and there is a possibility that intended deposition characteristics cannot be achieved. Further, in the method of suppressing warpage of the target portion by forging the flange portion to increase the strength in the sputtering target integrated with a backing plate, there is a possibility that the entire target is deformed by the pressure due to the forging processing, variations in the hardness, orientation, and particle size of the target portion occur, and the deposition characteristics cannot be stabilized.

In view of the circumstances as described above, it is an object of the present invention to provide a sputtering target capable of inhibiting a target portion from being deformed while stabilizing the deposition characteristics, and a method of producing the sputtering target.

Solution to Problem

In order to achieve the above-mentioned object, a sputtering target according to an embodiment of the present invention includes: a plate-shaped target body formed of a metal material.

The target body includes a target portion and a base portion.

The target portion has a sputtering surface.

The base portion has a cooling surface and includes a gradient strength layer, the cooling surface being positioned on a side opposite to the sputtering surface and having hardness higher than that of the sputtering surface, the gradient strength layer having tensile strength that gradually decreases from the cooling surface toward the target portion.

In the sputtering target, since the base portion has a cooling surface having hardness higher than that of the sputtering surface and a gradient strength layer having tensile strength that gradually decreases from the cooling surface to the target portion, it is possible to inhibit a target portion from being deformed while stabilizing the deposition characteristics.

The gradient strength layer is typically a work hardened layer.

The metal material may be a metal material that mainly contains aluminum, the target portion has tensile strength of 35 N/mm$^2$ or less, and the gradient strength layer may have tensile strength of 30 N/mm$^2$ or more and 55 N/mm$^2$ or less.

An average value of crystal orientation ratios (200/111) of the sputtering surface may be 1.3 or more and 7.0 or less, and an average value of crystal orientation ratios (200/111) of the cooling surface may be 0.8 or more and 1.2 or less.

In this case, the sputtering target may further include a cylindrical flange portion that is bonded to a periphery of the cooling surface and formed of a metal material mainly containing aluminum.

A method of producing a sputtering target according to an embodiment of the present invention includes: preparing a plate-shaped target blank.

A gradient strength layer is formed by performing plastic working on a surface of the target blank opposite to a sputtering surface, the gradient strength layer having tensile strength that gradually decreases toward the sputtering surface.

Advantageous Effects of Invention

As described above, according to the present invention, it is possible to inhibit a target portion from being deformed while stabilizing the deposition characteristics.

MODE(S) FOR CARRYING OUT THE INVENTION

Hereinafter, an embodiment of the present invention will be described with reference to the drawings.

[Sputtering Target]

Figure 1:
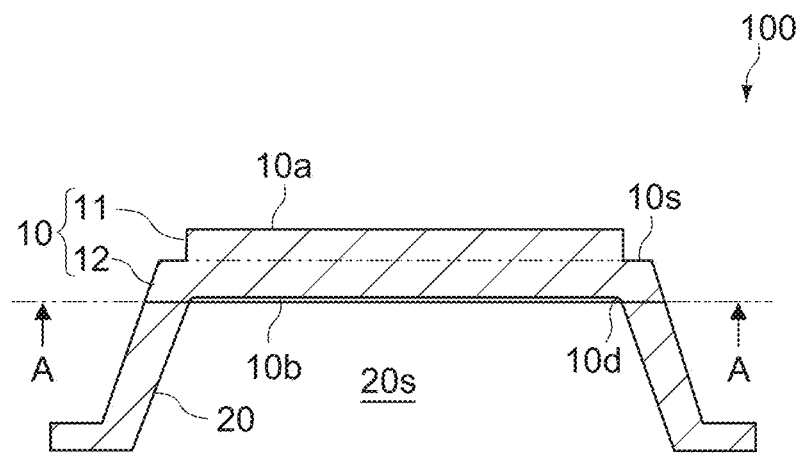
FIG. 1 is a longitudinal cross-sectional view schematically showing a configuration of a sputtering target according to an embodiment of the present invention.
Figure 2:
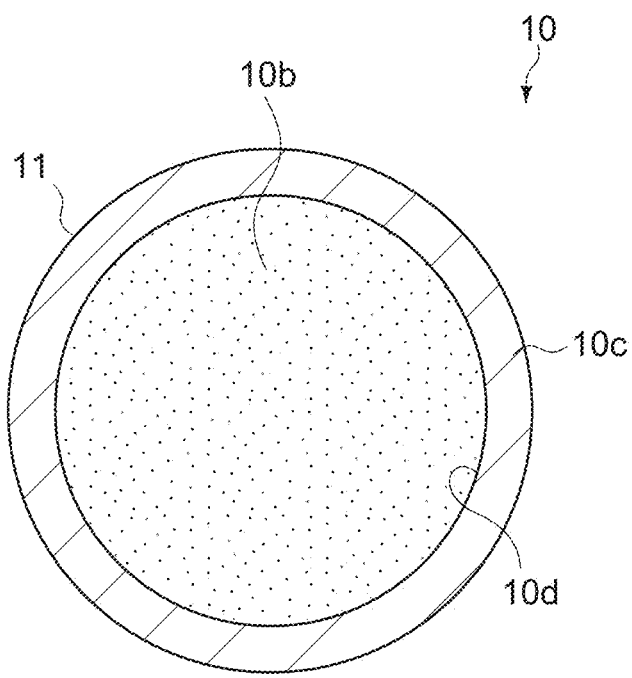
FIG. 2 is a cross-sectional view taken along the line A-A in FIG. 1.

FIG. 1 is a longitudinal cross-sectional view schematically showing a configuration of a sputtering target according to an embodiment of the present invention, and FIG. 2 is a cross-sectional view taken along the line A-A in FIG. 1.

A sputtering target 100 according to this embodiment includes a plate-shaped target body 10 and a cylindrical flange portion 20, and is configured by a bonded body of the target body 10 and the flange portion 20. In this embodiment, each of the target body 10 and the flange portion 20 is formed of a metal material mainly containing Al (aluminum) (hereinafter, referred to also as the Al-based metal material).

Examples of the Al-based metal material includes pure Al and an Al alloy. Examples of the Al alloy include a metal material obtained by adding, to pure Al, at least one type of Si (silicon), Cu (copper), Mg (magnesium), Zn (zinc), Fe (iron), Mn (manganese), Ni (nickel), Ti (titanium), Cr (chromium), Ca (calcium), Zr (zirconium), Na (sodium), Sr (strontium), Sb (antimony), Be (beryllium), P (phosphorus), V (vanadium), Sn (tin), Pb (lead), Bi (bismuth), Co (cobalt), and C (carbon) as an alloy element.

The target body 10 is formed in a disc shape, and has a sputtering surface 10a as a front surface and a cooling surface 10b as a back surface. The diameter of the target body 10 is not particularly limited, and is, for example, 300 mm or more. The sputtering surface 10a is an area to be sputtered by plasma (plus ion) inside a vacuum chamber (not shown) and is typically formed in a plane. The cooling surface 10b is an area that is located on a side opposite to the sputtering surface 10a, and cooling water introduced into a the space portion 20s inside the flange portion 20 is in contact with this area.

The target body 10 includes a target portion 11 having the sputtering surface 10a, and a base portion 12 having the cooling surface 10b. That is, the target portion 11 forms a predetermined thickness area of the target body 10 from the sputtering surface 10a, and the base portion 12 forms a thickness area of the other part of the target body 10 including the cooling surface 10b.

The boundary between the target portion 11 and the base portion 12 may be clear and does not necessarily need to be clear. In this embodiment, by providing an annular step portion 10s in the peripheral portion on the sputtering surface 10a side, a small-diameter portion and a large-diameter portion are formed in the target body 10. For example, the small-diameter portion is the target portion 11 and the larger-diameter portion the base portion 12. It goes without saying that the present invention is not limited thereto, and also the formation of the step portion 10s may be omitted.

The thickness of the target body 10 is not particularly limited, and is typically 20 mm or more and 50 mm or less. The thickness of the target portion 11 is 10 mm or more and 25 mm or less.

The base portion 12 has a function of supporting the target portion 11 and suppressing deformation and warpage of the target portion 11. Since the base portion 12 is integrally formed with the target portion 11, it is possible to configure a target assembly integrated with a target portion without requiring a bonding material. Further, it is possible to eliminate the concern of melting of the bonding material due to the increase in density of sputtering power (increase in output capacity).

A target blank of a predetermined size is prepared, and then, plastic working to be described below is performed on the cooling surface 10b, thereby preparing the target body 10. The above-mentioned target blank is typically prepared by performing predetermined rolling processing, shape processing, and the like on a melted and cast ingot of the Al-based metal material. At this time, the target blank is prepared under the processing conditions that the entire target blank matches various properties such as the tensile strength, the crystal orientation, and the crystal grain size required for the target portion 11. In this embodiment, the target blank is prepared so that the (200) plane of the crystal orientation of the sputtering surface is dominant. After that, predetermined processing is performed on the back surface of the target blank to form the cooling surface 10b, thereby preparing the base portion 12.

In this embodiment, the target portion 11 on the side of the sputtering surface 10a is prepared so that, for example, the tensile strength (0.2% proof stress, the same applies hereinafter) is 35 N/mm$^2$ or less, the average hardness (Hv) is less than 20, the average value of the crystal orientation ratio (200/111) is 1.3 or more and 7.0 or less, and the average particle size is 60 μm or less. As a result, it is possible to perform sputter deposition with less abnormal discharge and excellent deposition characteristics.

Meanwhile, the base portion 12 on the side of the cooling surface 10b is prepared so that the tensile strength is 45 N/mm$^2$ or more, the average hardness (Hv) is 20 or more, and the average value of the crystal orientation ratio (200/111) is 0.8 or more and 1.2 or less. As a result, it is possible to effectively inhibit the target body 10 from being deformed due to a water pressure of cooling water and a thermal stress.

As shown in FIG. 2, the cooling surface 10b of the base portion 12 is formed on a part of the back surface of the target body 10. In this embodiment, the cooling surface 10b is a circular area concentric with the base portion 12, and the outer peripheral area thereof is formed as an annular bonding surface 10c to be bonded to the flange portion 20. The cooling surface 10b is located inside a circular shallow recessed portion 10d formed on the back side of the target body 10, and the bonding surface 10c is located outside the recessed portion 10d.

Figure 3:
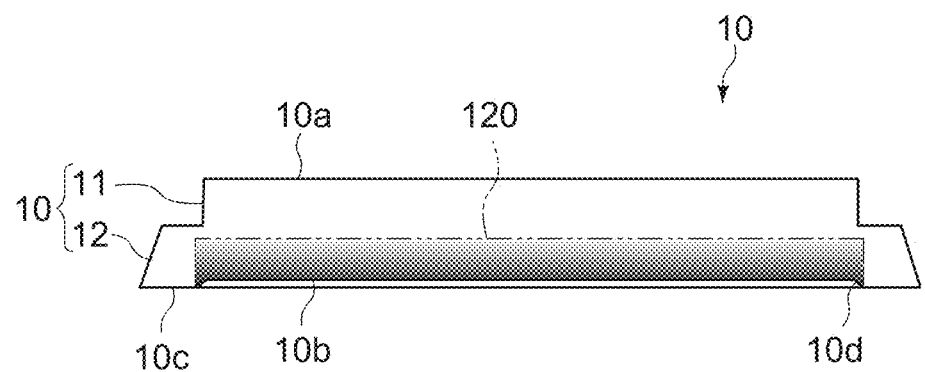
FIG. 3 is a cross-sectional view of a target body schematically showing a gradient strength layer.

The cooling surface 10b is formed by performing plastic working on the back surface of the target body 10, and has hardness higher than that of the sputtering surface 10a by work hardening. Further, the base portion 12 includes a gradient strength layer having the tensile strength that gradually decreases from the cooling surface 10b toward the target portion 11 by the above-mentioned plastic working. FIG. 3 is a cross-sectional view of the target body 10 schematically showing a gradient strength layer 120.

As shown in FIG. 3, the gradient strength layer 120 is a work hardened layer formed on at least a part of the thickness area of the base portion 12 between the target portion 11 and the cooling surface 10b. The gradient strength layer 120 is formed so that the tensile strength is higher in an area closer to the cooling surface 10b. FIG. 3 shows that a darker area is higher in strength. The gradient strength layer 120 may be formed over the entire region of the base portion 12 in the thickness direction or only in a partial area on the side of the cooling surface 10b.

Figure 4:
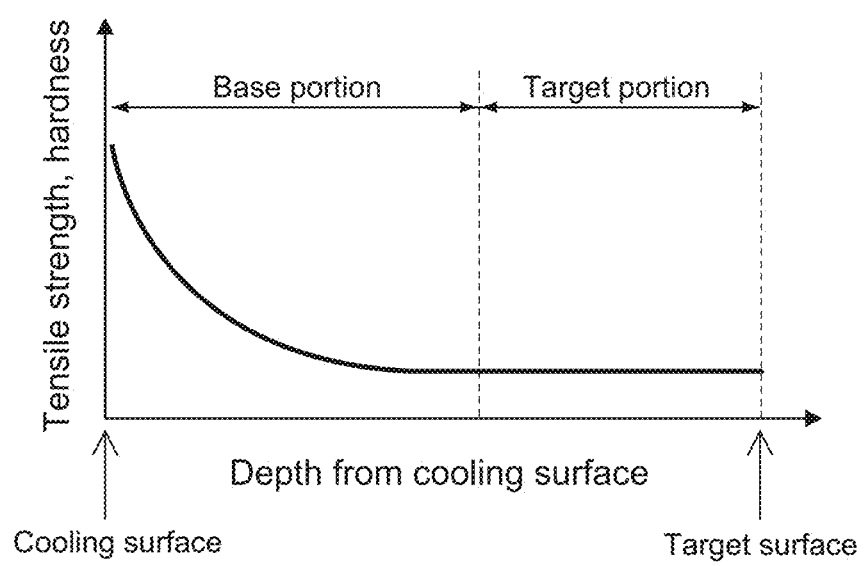
FIG. 4 is a schematic diagram showing describing the strength distribution of the above-mentioned gradient strength layer.

There is a certain correlation between tensile strength and hardness. Typically, as schematically shown in FIG. 4, the tensile strength and hardness of the gradient strength layer 120 have a distribution that gradually decreases as the depth from the cooling surface 10b increases. That is, the gradient strength layer 120 has a form in which a plurality of layers having different strengths, e.g., a first layer having a first tensile strength, a second layer having a second tensile strength higher than the first tensile strength, and a third layer having a third strength higher than the second tensile strength, continues from the cooling surface 10b toward the target portion 11. The tensile strength of each layer typically varies continuously and the boundaries between the layers are not necessarily clear.

The minimum values of the tensile strength and hardness of the gradient strength layer 120 respectively correspond to the tensile strength and hardness of the target portion 11. As a result, it is possible to secure desired sputtering characteristics or deposition characteristics by suppressing changes in the crystal orientation and the crystal grain size of the sputtering surface 10a.

The flange portion 20 is bonded to the bonding surface 10c of the target body 10 by electron beam welding or friction stir welding (FSW). The bonding method is not limited thereto, and a solid phase bonding method such as diffusion bonding or a bonding method using an appropriate bonding material such as indium may be employed. The flange portion 20 is for fixing the target body 10 to a stationary portion such as a top plate of a vacuum chamber (not shown), and a plurality of mounting holes through which fasteners such as bolts are inserted is formed at the tip portions thereof. The flange portion 20 is typically formed in a cylindrical shape, but may be formed in an elliptical tube or a rectangular tube. The cylindrical shape includes not only a simple straight tube shape but also a conical shape whose outer diameter decreases toward the bonding surface 10c as shown in the figure.

In the space portion 20s inside the flange portion 20, a magnetic circuit unit that forms a magnetic field in the vicinity of the sputtering surface 10a is disposed although not shown. The magnetic circuit unit includes a permanent magnet and a yoke. The magnetic circuit unit is statically set in the space portion 20s and forms a static magnetic field in the vicinity of the sputtering surface 10a. Alternatively, the magnetic circuit unit may be disposed to be rotatable around the central axis of the target body 10 in the space portion 20s. In this case, a predetermined rotating magnetic field is formed in the vicinity of the sputtering surface 10a.

Cooling water is supplied to the space portion 20s of the flange portion 20 through an introduction passage (not shown). The cooling water supplied to the space portion 20s cools the target body 10 via the cooling surface 10b of the target body 10 and cools the magnetic circuit unit disposed in the space portion 20s. As a result, excessive heat generation of the target body 10 during sputter deposition is suppressed, and the target body 10 is cooled to a predetermined temperature or less.

Figure 5A:
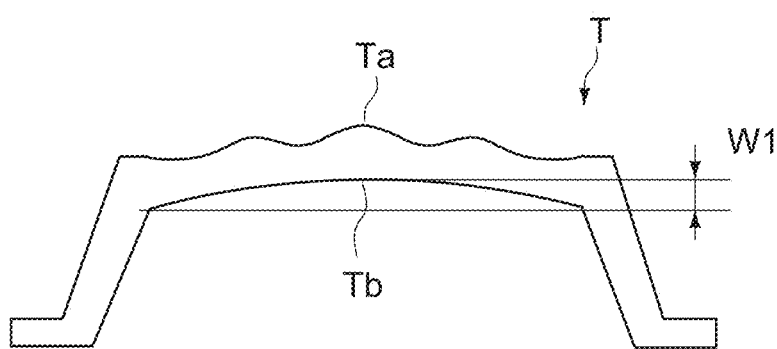
FIGS. 5A and 5B are schematic diagrams describing a difference in action between a sputtering target (FIG. 5A) that does not include the above-mentioned gradient strength layer and a sputtering target (FIG. 5B) that includes the above-mentioned gradient strength layer.

In general, during sputter deposition, a water pressure of cooling water and a stress due to thermal expansion simultaneously act on the cooling surface of the target body, and the stress that causes a target portion T to be deformed from a cooling surface Tb side to a sputtering surface Ta as schematically shown in FIG. 5A increases as the thickness of the target portion decreases due to the sputtering effect on the sputtering surface. For this reason, an Al-based metal target having relatively low strength is deformed to such a degree that permanent deformation exceeding the yield point is generated (warping amount W1), which results in fluctuations in deposition characteristics such as the film thickness distribution and the deposition rate.

Figure 5B:
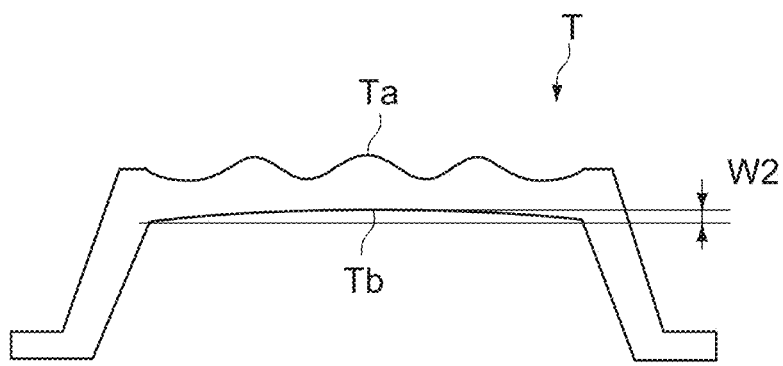

Meanwhile, in the sputtering target 100 according to this embodiment, the base portion 12 of the target body 10 includes the gradient strength layer 120 having the above-mentioned configuration. As a result, since the cooling surface 1011 having hardness and strength higher than those of the sputtering surface 10a is obtained, it is possible to increase the deformation strength of the cooling surface 10b while securing the crystal orientation of the sputtering surface 10a and the uniformity of the crystal grain size. As a result, it is possible to effectively inhibit the target body 10 to be deformed due to the water pressure of cooling water and the effect of the thermal stress, a warping amount W2 of the target body 10 is suppressed to be small (W2<W1) as schematically shown in FIG. 5B, and it is possible to secure desired deposition characteristics of the target portion 11.

[Method of Producing Sputtering Target]

The sputtering target having the above-mentioned configuration can be produced as follows.

First, a target blank is prepared as described above, and then, a pressure is applied to one (corresponding to the back surface of the target body 10) of the main surfaces thereof by a mechanical method to locally perform plastic working. At this time, it is favorable that the other main surface (corresponding to the front surface of the target body 10) of the target blank is not affected by the plastic working.

Examples of the method for plastic working include (a) hammering, (b) machining using a press machine, a stamp mill grinder, a roller, or the like, (c) shot peening, and (d) machining using a rotating body such as a leutor and a grinder. Among them, the processing method of applying a static load to the back surface of the target blank is favorable in that the crystal orientation of the sputtering surface and the crystal grain size can be stably maintained as compared with the processing method of applying an impact load because propagation of a stress to the sputtering surface side can be suppressed.

The above-mentioned machining may include cutting. Typical examples of the cutting include processing of planarizing the plastic working area on the back surface of the target blank by cutting. By this processing, the recessed portion 10d and the flat cooling surface 10b formed inside the recessed portion 10d are formed on the back surface of the target body 10.

The hardness of the cooling surface 10b is not particularly limited, and can be appropriately set in accordance with the constituent material, size, thickness, and the like of the target body 10. For example, in the case where the target body 10 is formed of an Al-based metal material, the diameter of the target body is 152 mm or more and 650 mm or less, and the thickness 20 mm or more and 50 mm or less, the hardness (Vickers hardness) of the cooling surface 10b is favorably 18 Hv or more and 30 Hv or less, for example. That is, by setting the hardness of the cooling surface 10b to 18 Hv or more, it is possible to impart, to the base portion 12, sufficient strength for suppressing warpage of the target body 10 due to a decrease in the thickness of the target portion 11 due to sputtering. Meanwhile, by setting the hardness of the cooling surface 10b to 30 Hv or less, it is possible to maintain the crystal orientation of the sputtering surface 10a and the uniformity of the crystal grain size, and secure favorable deposition characteristics. The Hv hardness of the sputtering surface 10a in this case is, for example, 17 or less.

Similarly, also the tensile strength distribution of the gradient strength layer 120 can be appropriately set in accordance with the constituent material, size, thickness, and the like of the target body 10. In the case where the target body 10 is formed of an Al-based metal material, the diameter of the target body is 152 mm or more and 650 mm or less, and the thickness is 20 mm or more and 50 mm or less as described above, for example, the tensile strength distribution of the gradient strength layer 120 is favorably 30 $N/mm^2$ or more and 55 $N/mm^2$ or less, for example. As a result, it is possible to impart, to the base portion 12, sufficient strength for suppressing warpage of the target body 10 due to a decrease in the thickness of the target portion 11 due to sputtering. As the tensile strength, typically, the value of a stress at which 0.2% permanent deformation occurs, i.e., the value of 0.2% proof stress is used.

Note that the base portion 12 may be used by using any of the Hv hardness of the cooling surface 10b and the tensile strength of the gradient strength layer 120 as an index. Since there is a certain correlation between tensile strength and hardness as described above, the tensile strength of the gradient strength layer 120 can be controlled within a predetermined range by, for example, adjusting the hardness of the cooling surface 10b to a target value. Alternatively, it is of course possible to adjust the strength distribution of each of the cooling surface 10b and the gradient strength layer 120 in accordance with the working amount of plastic working during the formation of the gradient strength layer 120.

Experimental Example

The present inventors prepared a sputtering target in the following procedure.

An Al-0.5 wt % Cu alloy was melted and cast as an Al-based metal material to prepare a target blank having a diameter of 600 mm and a thickness of 37 mm (the thickness of a target portion is 12 mm, the thickness of a base portion is 25 mm).

Subsequently, local plastic working (machining) was performed on a to-be-processed area having a circular shape in the range of φ400 mm from the center of the back surface of the target blank by the following method.

First, as a pressing jig, a rigid plate having a diameter of 400 mm in which zirconia balls having a diameter of 10 mm were spread on one surface via a resin layer was prepared, and this was set on a movable portion of a press machine. Subsequently, the target blank was set on the mounting table of the press machine so that the to-be-processed area is directed upward and faces the protruding surface of the pressing jig, and the to-be-processed area was pressed with the pressing jig under predetermined pressing conditions. The pressing conditions were set so that the pressing processing was automatically stopped when the pressing load reached 980 kN or the pressing jig lowered 3 mm after coming into contact with the to-be-processed area.

After the pressing, the pressing jig was raised, and then, the pressing jig was rotated around the center by 5° and set again on the press machine. Then, the to-be-processed area was pressed again under the same pressing conditions. Thereafter, this processing was repeated until the pressing jig was rotated three times. After the series of pressing processing is completed, by removing, by machinery (cutting), the area in the area (φ460 mm from the center, 2 mm in depth) in which the back surface of the target blank was deformed, the target body 10 including the base portion 12 having the flat cooling surface 10b was prepared. After that, a flange portion was bonded to the outer side of the cooling surface of the target body to prepare a hat-type sputtering target.

A plurality of samples having different depths from the cooling surface of the prepared target body was collected and processed into a test piece shape of JIS 13B, and the tensile strength (0.2% proof stress) and hardness (Vickers hardness Hv) of each of the samples were measured by a tensile test method according to JISZ2241. As a testing machine, "AG 25 TB-R" manufactured by Shimadzu Corporation was used. The results are shown in FIG. 6 and FIG. 7.

Figure 6:
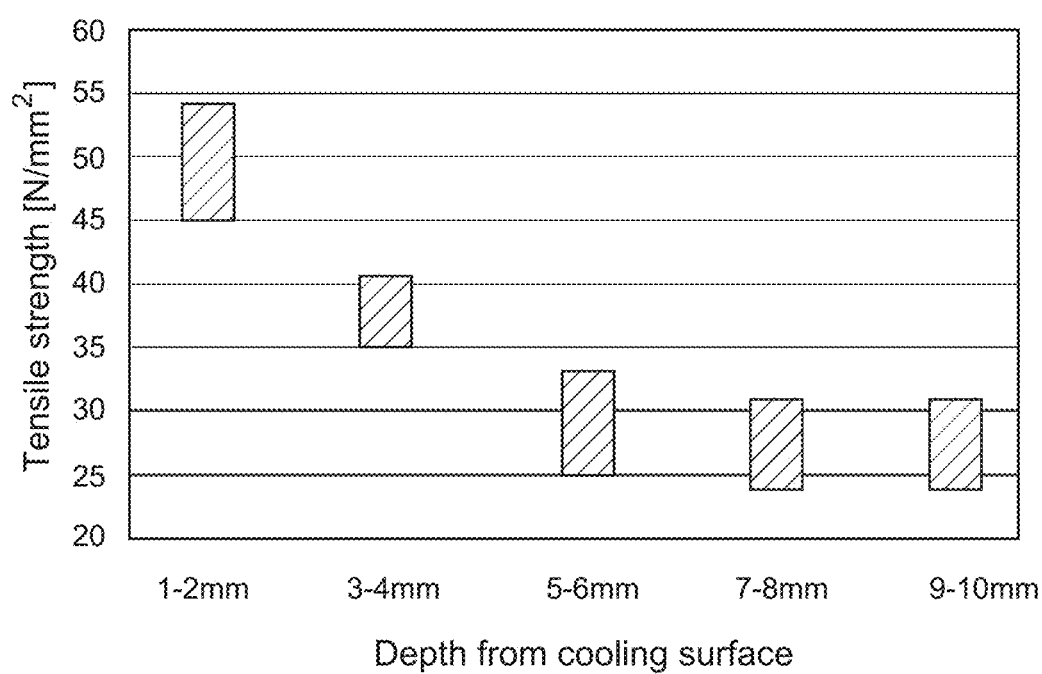
FIG. 6 is a diagram showing the relationship between the depth from a cooling surface of a sputtering target and the tensile strength in one Example.

FIG. 6 is a diagram obtained by plotting the tensile strength of each of the above-mentioned samples, and shows changes in the tensile strength of the base portion 12 in the thickness direction. Note that "1-2 mm" in the horizontal axis means the sample cut out over the range of 1 mm to 2 mm of the depth from the cooling surface (the same applies to "3-4 mm", "5-6 mm", "7-8 mm", and "9-10 mm"). The length of each plot in the vertical direction represents variation.

As shown in the figure, it is confirmed that a gradient strength layer having the tensile strength that gradually decreases from the cooling surface to the target portion is formed. In the thickness area where the depth from the cooling surface is 8 mm or more, the decrease in the tensile strength stops and the tensile strength converges to a constant value. This value is a value corresponding to the tensile strength of the target portion.

Figure 7:
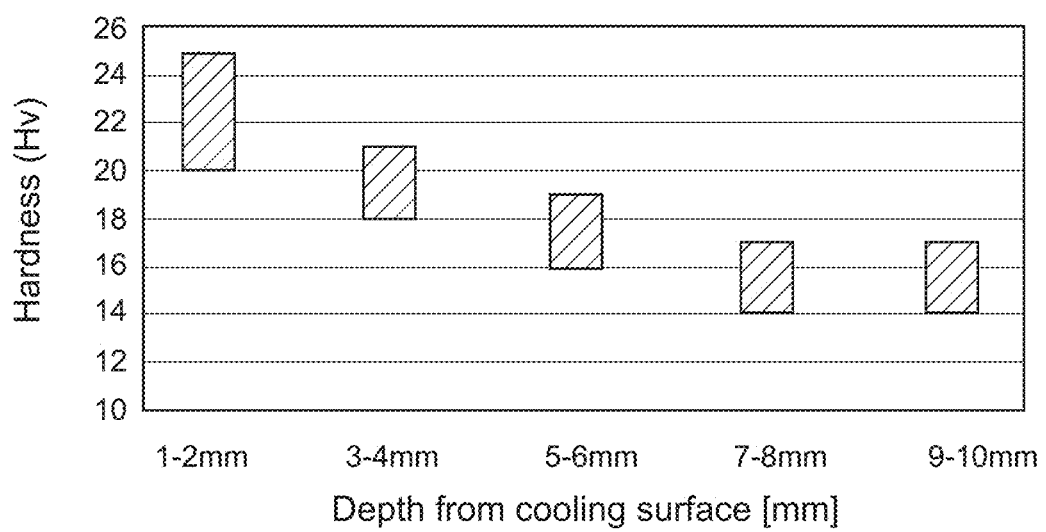
FIG. 7 is a diagram showing the relationship between the depth from a cooling surface of a sputtering target and the tensile strength in one Example.

FIG. 7 is a diagram obtained by plotting the hardness of each of the samples, and shows changes in the hardness of the base portion 12 in the thickness direction. The length of each plot in the vertical direction represents variation. From the figure, it is confirmed that the hardness gradually decreases from the cooling surface toward the target portion. Although not shown, the hardness (Hv) of the sputtering surface is 16 Hv, and substantially matches the hardness at the depth of 10 mm from the cooling surface.

When the crystal orientation ratios (200/111) in the central portion (area 1) of the cooling surface, an outer peripheral portion (area 2), and an intermediate portion (area 3) therebetween were checked by X-ray diffraction, the obtained values were respectively 1.22, 0.95, and 0.74 in the area 1, the area 2, and the area 3. The average value of these values was 0.97.

Meanwhile, also the crystal orientation ratios (200/111) of in the central portion (area 1) of the sputtering surface, an outer peripheral portion (area 2), and an intermediate portion (area 3) therebetween were checked similarly, the obtained values were respectively 6.3, 5.0, and 4.1 in the area 1, the area 2, and the area 3. The average value of these values was 5.1.

Subsequently, the prepared sputtering target was set in a sputtering device and actually sputtered, and warpage of the target portion after use of 2000 kW/h was evaluated. Here, the sputtering processing was continuously performed under the sputtering conditions that the water pressure of the cooling surface was 0.3 MPa or more and the sputtering power was 30 kW or more. As a result, in the case where the water pressure that acted on the cooling surface was 0.4 MPa, the warpage of the target body that does not include a gradient strength layer was 3 mm or more, whereas the warpage of the target body was less than 1 mm in this embodiment including a gradient strength layer.

Further, when the in-plane uniformity of the sheet resistance when depositing an Al-based metal film having a thickness of 400 nm on a substrate using a sputtering target that includes a gradient strength layer was evaluated, the obtained values were respectively 4.28% and 5.59% when the target life was 150 kW/h and 1250 kW/h. From this fact, it was confirmed that deposition characteristics similar to the in-plane uniformity (5.45% at 138.5 kW/h, 5.20% at 1132.6 kW/h) of the sheet resistance in the case of using a sputtering target that does not include a gradient strength layer were achieved.

Although an embodiment of the present invention has been described, it goes without saying that the present invention is not limited to only the above-mentioned embodiment and various modifications can be made.

For example, although a sputtering target formed of an Al-based metal material has been described as an example in the above-mentioned embodiment, the present invention is applicable similarly also to a sputtering target formed of another metal material such as pure Cu and In.

REFERENCE SIGNS LIST 10 target body
10a sputtering surface
10b cooling surface
11 target portion
12 base portion
20 flange portion
120 gradient strength layer

The invention claimed is:
1. A sputtering target, comprising:
a plate-shaped target body formed of a metal material, the target body including
   a target portion having a sputtering surface, and
   a base portion that has a cooling surface and an annular bonding surface and includes a gradient strength layer, the cooling surface being positioned on a side opposite to the sputtering surface and having hardness higher than that of the sputtering surface, and the annular bonding surface being positioned outside the cooling surface; and
a cylindrical flange portion that is bonded to the annular bonding surface,
   wherein the cooling surface and the annular bonding surface form a back surface of the plate-shaped target body,
   wherein the cooling surface is part of the gradient strength layer,
   wherein the gradient strength layer is a single, continuous layer,
   wherein the gradient strength layer is disposed entirely within the base portion,
   wherein the gradient strength layer has tensile strength that decreases from the cooling surface toward the target portion, such that a first tensile strength at the cooling surface is greater than a second tensile strength at a first depth from the cooling surface, the second tensile strength being greater than a third tensile strength at a second depth from the cooling surface greater than the first depth, the third tensile strength being greater than a fourth tensile strength at a third depth from the cooling surface greater than the second depth, the fourth tensile strength being greater than a fifth tensile strength at a fourth depth from the cooling surface greater than the third depth, and the fifth tensile strength being greater than a sixth tensile strength at a fifth depth from the cooling surface greater than the fourth depth, and wherein the gradient strength layer has a hardness that decreases from the cooling surface toward the target portion, such that a first hardness at the cooling surface is greater than a second hardness at the first depth from the cooling surface, the second hardness being greater than a third hardness at the second depth from the cooling surface, the third hardness being greater than a fourth hardness at the third depth from the cooling surface, the fourth hardness being greater than a fifth hardness at the fourth depth from the cooling surface, and the fifth hardness being greater than a sixth hardness at the fifth depth from the cooling surface.

2. The sputtering target according to claim 1, wherein the gradient strength layer is a work hardened layer.

3. The sputtering target according to claim 1, wherein the metal material is a metal material that mainly contains aluminum, the target portion has tensile strength of 35 N/mm$^2$ or less, and the gradient strength layer has tensile strength of 30 N/mm$^2$ or more and 55 N/mm$^2$ or less.

4. The sputtering target according to claim 3, wherein an average value of crystal orientation ratios (200/111) of the sputtering surface is 1.3 or more and 7.0 or less, and an average value of crystal orientation ratios (200/111) of the cooling surface is 0.8 or more and 1.2 or less.

5. The sputtering target according to claim 3, wherein the cylindrical flange portion formed of a metal material mainly containing aluminum.

6. A method of producing a sputtering target, comprising:

preparing a plate-shaped target blank including a sputtering surface and a cooling surface opposite to the sputtering surface and an annular bonding surface positioned outside the cooling surface;

forming a gradient strength layer by locally performing plastic working on the cooling surface of the target blank, the gradient strength layer having tensile strength that decreases toward the sputtering surface; and bonding a cylindrical flange portion to the annular bonding surface, wherein the cooling surface is part of the gradient strength layer, wherein the gradient strength layer is a single, continuous layer, wherein the sputtering target comprises a target portion and a base portion, the target portion comprising the sputtering surface, and the base portion comprising the cooling surface, the annular bonding surface, and the gradient strength layer, wherein the gradient strength layer is disposed entirely within the base portion, and wherein the gradient strength layer has a hardness that decreases from the cooling surface toward the sputtering surface.

* * * * *